United States Patent
Tighe et al.

[19]

[11] Patent Number: 6,055,722
[45] Date of Patent: May 2, 2000

[54] STRIPLINE FLEXIBLE CABLE TO PRINTED CIRCUIT BOARD ATTACHMENT SYSTEM

[75] Inventors: Thomas S. Tighe, Pasadena; Gershon Akerling, Culver City, both of Calif.

[73] Assignee: TRW Inc., Redondo Beach, Calif.

[21] Appl. No.: 09/081,925

[22] Filed: May 20, 1998

[51] Int. Cl.[7] .................................................. H05K 9/06
[52] U.S. Cl. ............................... 29/843; 29/839; 29/842
[58] Field of Search ............................. 29/843, 842, 839, 29/860

[56] References Cited

U.S. PATENT DOCUMENTS

| | | | |
|---|---|---|---|
| H487 | 7/1988 | Clark et al. | 29/843 |
| 4,668,581 | 5/1987 | Luc et al. | 29/843 X |
| 5,339,519 | 8/1994 | Fortune | 29/843 X |
| 5,966,805 | 10/1999 | Akiha et al. | 29/843 |
| 5,970,608 | 10/1999 | Tighe et al. | 29/843 |

*Primary Examiner*—Lee Young
*Assistant Examiner*—Rick Kiltae Chang
*Attorney, Agent, or Firm*—Michael S. Yatsko; Ronald M. Goldman

[57] ABSTRACT

Shielded stripline multi-lead flex cable is successfully attached to solder pads on a circuit board by applying a hot bar to the backside of the cable placed in abutment with the associated solder pads. The hot bar generates sufficient heat to reflow pretinned cable elements and the corresponding solder pads of the circuit board. An attachment is attained in which the outer ground plane metal layer of the cable covers the signal lines and the other ground plane metal layer is attached adjacent those signal lines, producing effective RF shielding of the signal leads and minimizing introduction of inductance into the ground current circuit. A novel cable end configuration and cable termination is disclosed to implement the attaching procedure.

7 Claims, 4 Drawing Sheets

STRIPLINE FLEXIBLE CABLE TO PRINTED CIRCUIT BOARD ATTACHMENT SYSTEM

This invention was made with Government support under F0406-95-D-0069 awarded by Department of the Air Force.

FIELD OF THE INVENTION

This invention relates to an attachment system to attach the multiple electrical conductors in a flat flexible electrical cable to corresponding multiple connections on a printed circuit boards, and, more particularly, to a new method and apparatus for efficiently simultaneously soldering large numbers of minute electrical conductors of shielded multi-conductor flex cables to soldering pads on a printed circuit board.

BACKGROUND

A number of companies, such as IBM and Packard-Hughes, produce high density flexible electrical cables, often referred to as "flex cable", for use in routing electronic data. The flex cables pack a large number of separate metal conductors, the signal lines, that are insulated from one another within a relatively thin flat web of limited width. In appearance the cable resembles a thick stiff belt. The cable may be bent around corners or wrapped, much like an ordinary leather belt.

To meet the growing number of inputs and outputs required for microelectronic circuits and packages, those and other companies have designed and fabricated high density flexible cables containing 125 signal lines or greater per inch of width. The cables incorporate a polyimide film as a substrate for lithographically defined electrical conductors or, as variously termed, signal lines. The majority of flex cables currently used in electronic packaging are not shielded; that is the cables do not include metallic ground planes or shields located in close proximity to the signal lines. Although such unshielded lines are suitable for signals at frequencies of ten MegaHertz or less, at higher frequencies, the signals suffer unacceptable power loss.

By incorporating shields and/or ground planes within the cable, flex cables are ideally suited for routing signals at high frequencies or rates at up to 10 Gigahertz and greater. Two forms of flex cables are available, a microstrip configuration, such as from Tektronix company, and a strip line configuration. Both configuration will carry signals without significant power loss, but the stripline configuration suffers less power loss than the microstrip configuration.

In the stripline configuration the substrate containing the signal lines is sandwiched in-between two metal layers, the ground planes, and are separated therefrom by insulating films, such as polyimide film used for the substrate, a strong flexible plastic electrical insulating material. As brought out in the description that follows in this specification that electrically insulating material also is found to possess favorable thermal characteristics that enables the practice of the invention. In practice, the flex cables also frequently include an outer insulating wrap, also formed of a polyimide film, to the foregoing configuration. In contrast, the microstrip configuration of the flex cable contains only a single ground plane layer.

Due to the multi-layer structure of the flex cable, it becomes difficult to properly attach the cable ends to external electrical components or circuits, such as found on a circuit board or other substrate. A typical application requires the cable's signal lines to be soldered to appropriate contacts on a printed circuit board, with those contacts typically being organized in a rectangular array formed by one or more rows of contacts. With 125 lines packed into a one inch width, soldering connections poses somewhat of a challenge. One practice of meeting the high density of signal lines is to fan out the signal lines to more widely displaced contacts on the circuit board, a practice that requires a greater area for the cable termination on the circuit board.

Further, both of the stripline cable's ground planes require connection to ground connections on the printed circuit board. Those ground plane connections must be made in the immediate vicinity of the location on the circuit board at which the signal lines are attached. If the ground connections are not so positioned, the ground current paths effectively introduce large inductances within the signal line circuits, thereby degrading the cable's electrical properties, more particularly, limiting the upper range of frequencies for which the cable is suited. Packard-Hughes company is known to market a shielded flex cable containing only a single ground plane. Because the ground plane in the Packard-Hughes cable is connected to the circuit board at a location distant from the connection of the signal lines, that cable cannot be regarded as either a microstrip or a stripline version, but is somewhat of a hybrid structure. Because of the distant ground connection, it is believed to suffer from degraded high frequency performance.

The attachment of flex cables containing fewer number of leads than the 125 lines per inch and above to corresponding solder pads on printed circuit boards has in the past been accomplished by exposing the ends of the signal lines, pre-tinning them with solder, and soldering them, simultaneously, to the respective solder pads on the circuit board. One known apparatus for simultaneously soldering multiple electrical leads of an electric cable to corresponding multiple cable contacts, solder pads, on printed circuit board is the hot bar station, a soldering apparatus marketed by the Uni-Tek Company of Monorovia, Calif.

That soldering apparatus contains a movable heated rectangular metal bar, called a hot bar. For soldering a longitudinal edge of the hot bar is brought into contact with the cable's exposed tinned copper leads. The hot bar is carried by a piston mechanism in the station, which is used to raise or lower the bar. Electrical leads from the station's power supply connect the front and back surfaces of the hot bar in a current conducting path to the power supply.

High levels of DC current through the metal bar, which possesses electrical resistance, produces $I^2R$ losses in the bar, creating the necessary heat for soldering. The generated heat is conducted to the edge of the hot bar and produces a temperature along that edge that is high enough to at least exceed the eutectic temperature of the solder being used to tin the cable leads and solder pads. As one appreciates the hot bar station is much like an ordinary electrical soldering iron in function and in principal, but performs the soldering function in locations and circumstances in which the soldering iron is impractical. The present invention also takes advantage of a hot bar station.

In typical operation, the exposed tinned copper leads of the cable are placed in contact with the corresponding solder pads, also tinned with solder, located on the printed circuit board. The two are clamped in that relationship on the bed of the hot bar station, which also serves as a heat sink. The electrically heated hot bar is lowered and its edge is placed in direct physical contact with the multiple exposed tinned leads, raising the latter to the eutectic temperature at which the solder reflows. Heat is also conducted from the tinned leads to the solder pads and the latter are also heated to the temperature at which the solder on those pads reflows. When the heating is halted, either by turning off the current to the hot bar or by withdrawing the hot bar, the liquified solder cools and re-solidifies, resulting in a soldered connection between the electrical leads and the corresponding solder pads on the circuit board.

Accordingly, an object of the present invention is to apply the hot bar station to a technique for soldering shielded high density stripline flex cables to external terminations, quickly and easily.

A further object of the invention is to provide a technique for soldering insulated electrical leads to solder pads on associated apparatus without requiring the heating source to have direct physical contact with either the leads or the solder pads.

A still further object of the invention is to provide a technique for simultaneously soldering large number of signal lines, 125 and greater, to corresponding terminations on a circuit board without requiring the signal lines to be fanned out.

And an ancillary object of the invention is to provide a new end configuration to a shielded high density stripline flex cable; and a new structure for a cable termination that mates with the end configuration and defines a new cable to circuit board attachment system.

SUMMARY OF THE INVENTION

In accordance with the foregoing objects, a method of solder attaching an insulated electrical lead in a cable to a solder coated soldering pad located on a printed circuit board is accomplished by exposing at least a bottom region of the lead's insulation, while retaining the top region of insulation and tinning the exposed lead portion; placing the tinned lead portion in contact with the solder coated soldering pad; and heating the top region of insulation overlying the exposed lead portion to permit heat to permeate through the insulation, the exposed lead portion and the soldering pad to reflow the solder on each, whereby the solder solidifies upon withdrawal of the heating source and makes the attachment.

The present invention is in part based on the discovery that it is possible to raise the temperature of the tinned exposed leads to the eutectic temperature without direct physical contact between those leads and the heating source, the hot bar. Instead it is discovered that the heating source can be applied to the electrical insulation and sufficient heat will nonetheless be conducted through that insulation and then to the electrical leads sufficient to raise the temperature to the leads to the eutectic temperature of solder and cause the solder to reflow, and without physically damaging the cable's electrical insulation.

This discovery has been made in practice using a flexible ribbon cable manufactured by the Tech-Etch company of Plymouth, Mass., a cable which employs a Kapton brand polyimide material for the insulating dielectric; and it is expected to have application to other cables that use equally robust dielectric materials.

The foregoing and additional objects and advantages of the invention together with the structure characteristic thereof, which was only briefly summarized in the foregoing passages, becomes more apparent to those skilled in the art upon reading the detailed description of a preferred embodiment, which follows in this specification, taken together with the illustration thereof presented in the accompanying drawings.

DETAILED DESCRIPTION OF THE PREFERRED EMBODIMENTS

Figure 1:
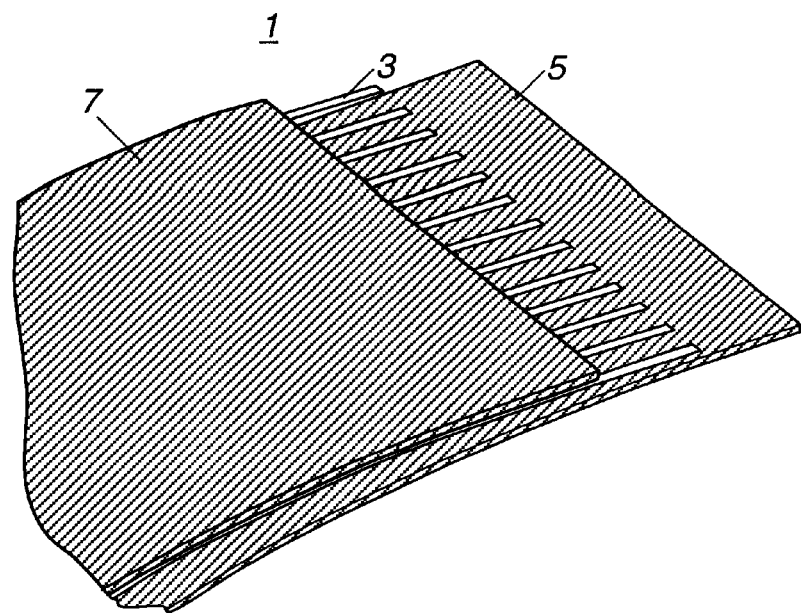
FIG. 1 illustrates a stripline cable used in the attachment system.
Figure 2:
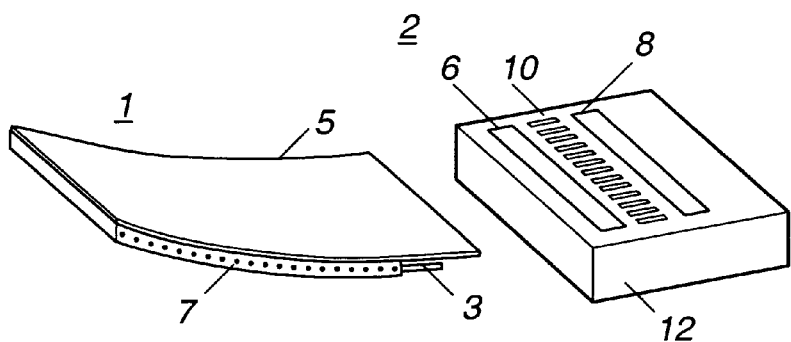
FIG. 2 illustrates the stripline cable of FIG. 1 and the cable termination portion of the attachment system drawn to smaller scale than FIG. 1.

Reference is made to FIGS. 1 and 2, which illustrate the attachment system. FIG. 1 pictorially illustrates a portion of a shielded multi-line flex cable 1, in an inverted "bottom side up" perspective view. The cable's distal end is modified to a step configuration, in accordance with the invention as herein described, exposing to view a plurality of the parallelly extending spaced metal leads or, as variously termed, signal lines 3. A metal layer, the upper ground plane 5 extends beyond the end of signal lines 3, and a second metal layer, the lower ground plane, terminates further back from the cable's distal end, permitting a portion of the signal lines to be uncovered and exposed for soldering.

For clarity and ease of understanding the invention, cable 1 is illustrated as having thirteen metal lines 3. However, it is understood that in practical application the invention is expected to be more useful with cables having one-hundred and twenty-five or greater signal lines per inch of width.

As pictorially illustrated in FIG. 2, drawn to a smaller scale, cable 1 is one part of an attachment structure and attaches to a cable termination, generally pictorially represented at 2. In this view cable 1 is illustrated in its proper orientation with metal layer 5 on top, called the "backside" of the cable. Cable termination 2 contains two elongated flat strips of metal 6 and 8, which are solder pads, and a plurality of metal lines, more particularly, solder pads 10. Solder pads 6, 8 and 10 are mounted to a substrate 12 that is formed of a dielectric material that is an electrical insulator. In practice, substrate 12, although separately illustrated, constitutes a portion of a printed circuit board of otherwise standard construction.

Typically circuit board 12, partially illustrated, is rigid in structure, relative to the flex cable, and is formed by conventional processing technique, not here described, in which the contacts 6, 8 and 10 are lithographically defined on the surface of the board. As one appreciates, a printed circuit board typically contains the wiring, not only for the cable termination illustrated, but also for interconnecting other circuit components that are to be mounted to the circuit board. As those other elements do not aid to an understanding to the present invention and are essentially immaterial, they are not illustrated or described. It should also be appreciated that the circuit board will contain internal or surface wiring that connect each of the solder pads 10 to appropriate locations in the electronic circuit contained on the board, and solder pads 6 and 8 to appropriate circuit portions as will place the later solder pads at electrical ground potential.

Figure 3:
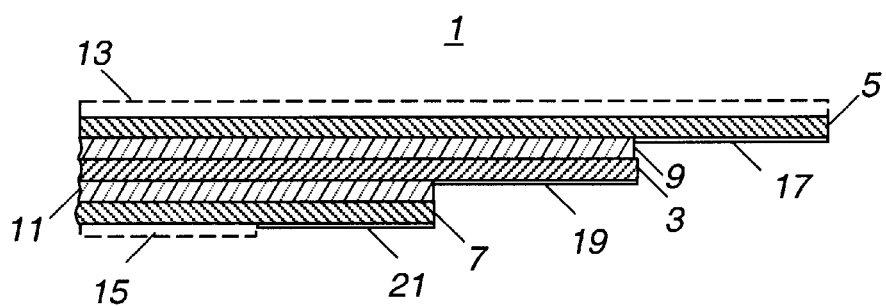
FIG. 3 is an enlarged section view of the cable of FIG. 1.

Returning to the description of the end configuration of cable 1, as depicted in FIG. 3 in larger scale, the end of the cable is an inverted step-wise configuration. As depicted in a side section view and in somewhat larger scale in FIG. 3, shielded flex cable 1 typically contains in the sandwich configuration the metal layer 5, which serves as a ground plane; a first insulating layer 9; an electrically insulative substrate layer containing metal lines 3, which serve as the signal lines; a second insulating layer 11; and the second metal layer 7 that serves as another ground plane. Typically, an overlying wrap 13 of electrical insulation is applied to the top of metal layer 5 and a like underlying wrap 15 of electrical insulation is applied to the outer surface of the other ground plane 7, the wraps being optional and illustrated in dash lines in the figure.

The metal layers 5 and 7 cover the entire width of the cable and serve as electrical shielding for the metal signal lines, that are spread out in parallel spaced relationship across that width.

Metal layer 5, defining the top ground plane, has at least the underside surface uncovered of insulator material, exposed, and that exposed surface extends to the cable's distal end. A length of the conductor signal lines 3 are also uncovered of insulating material, exposed, and insulating layer 9, substrate and conductors 3, insulating layer 11 and metal layer 7 are cut back accordingly. The signal lines are separated from the substrate and terminate a short distance from the cables distal end. Thus insulating layer 11 and metal layer 7 are cut back to uncover at least the underside surface of metal lines 3. Lastly, metal layer 7, defining the bottom ground plane, has a length of its underside surface uncovered of any insulating material, such as wrapping 15 and exposed. The later metal layer terminates at the longitudinal position at which signal lines 3 become exposed from the body of the cable. The foregoing end structure is seen as an inverted step-wise end geometry to the cable; the ends of the top ground plane layer 5, the signal lines 3 and the bottom ground plane layer 7 being successively staggered in position relative to the cable's distal end. As also illustrated the underside of metal layer 5, conductors 3 and metal layer 7 is tinned with a thin coating layer of solder, represented at 17, 19 and 21, respectively.

The foregoing step-wise geometry may be specified to the cable manufacturer, who will supply the cable to that configuration as desired for appropriate sums in payment. One such company that manufactures such to order is the Tech-Etch company of Plymouth, Mass. The exact procedure used by the manufacturer is not known, but it is believed that the appropriate procedure to attain that configuration is to use conventional masking and etching techniques.

Returning to FIG. 2, the printed circuit board 2 contains a ground plane solder pad 6, a row of contacts or solder pads 10 arranged in columns to mate with the corresponding signal lines 3 in the cable, and another ground plane solder pad 8, which are also staggered in position in a manner corresponding to the staggering of the cable components in FIG. 1 in order that one component will physically mate with the other.

The exposed metal portions, suitably Copper, of both cable 1 and printed circuit board 12 are pre-tinned with the appropriate solder, suitably an Indium Tin solder, which is conventional. Tinning is accomplished by conventional technique. That involves dipping the end of the cable in a molten bath of solder and then removing it, whereby the solder solidifies as a coating on the exposed metal layers, and on the exposed signal lines. That same procedure may be used to tin the solder pads of the printed circuit board. Alternatively, those solder pads may have the solder "screened" on, another known solder coating technique conventionally used with circuit boards.

In a practical example, the stripline cable used was a flexible ribbon manufactured by the Tech-Etch company of Plymouth, Mass. that was approximately that contained metal and electrical insulating layers and substrate, each 20 microns thick and one-hundred and twenty six signal lines, each of a four mil width, evenly spaced. The electrical insulating material is Kapton, a known polyimide material. The exact composition of the polyimide is not known and is a likely proprietary product of the cable manufacturer or of its insulation vendor.

Figure 4A:
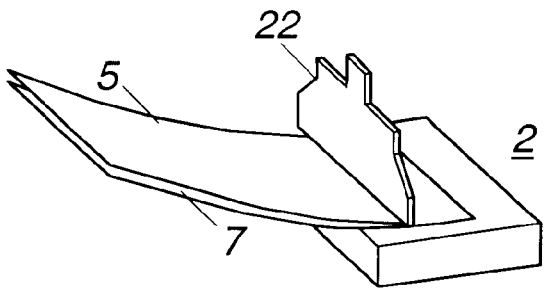
FIGS. 4A, 4B and 4C illustrate the new soldering process and the three solder operations to attach the shielded stripline cable end to the circuit board.
Figure 4B:
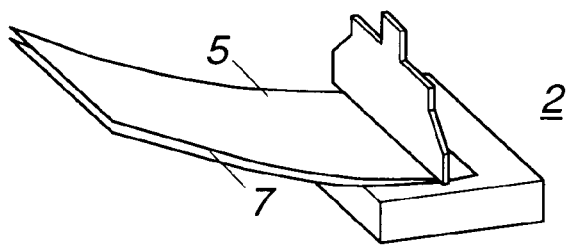
Figure 4C:
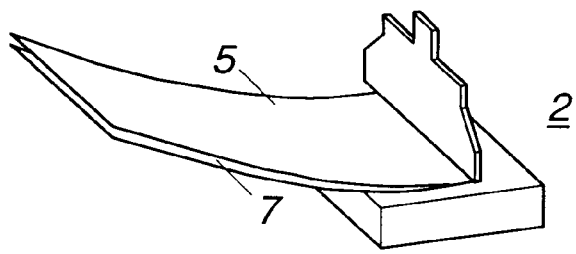

As represented in FIGS. 4A–4C, the soldering of the shielded cable's end is accomplished in three steps. In the first, represented in FIG. 4A, cable 1 and printed circuit board 2 are placed in mating contact and laterally positioned on the base, not illustrated, of the hot bar station so that its ground plane 7 and underlying solder pad 6 are aligned in position with the transversly extending edge of hot bar 22. The hot bar is lowered and its bottom edge is brought into direct contact with the outer insulating layer, or, if no outer wrap is used on the particular cable, into contact with the upper ground plane layer 5.

The hot bar is heated. That heat passes through the insulating wrap layer or the top metal layer 5, through the intervening insulating layer 9, the substrate layer and its signal lines 3, the next insulating layer 11 to the pre-tinned bottom (or front side) metal layer 7 and thence through the solder pad 6, the circuit board substrate 12, to the support base of the hot bar station, which functions also as a heat sink. The temperature generated by the hot bar is high enough so that at the bottom metal layer 7 the temperature exceeds the eutectic temperature of the solder coating, the temperature at which the solder melts, and, at the solder pad 6 on the circuit board also exceeds the eutectic temperature of that solder coating as well.

The solder then reflows. Upon reflowing, the heat is turned off, and the solder allowed to re-solidify, thereby connecting the bottom metal layer 7 to solder pad 6.

As example, the eutectic temperature of Indium Tin solder is 118 degrees Centigrade. The temperature of the hot bar is maintained at about 350 degrees Centigrade. It is found that the temperature at the bottom metal layer 7 is sufficient to exceed that eutectic temperature.

With the bottom metal layer attached, the cable and circuit board assembly is laterally moved along the hot bar station's base, an incremental distance to the left in the figure, until the exposed signal lines 3 and termination contacts 10 underlie hot bar 22. The hot bar is again heated and lowered into contact with the backside of cable 1. As before heat from the edge of hot bar 22 passes through the insulating wrap layer or the top metal layer 5, through the intervening insulating layer 9, the substrate layer and its signal lines 3, and thence through the solder pads 10, the circuit board substrate 12, to the support base of the hot bar station.

This formed serial heat transmission path is slightly shorter than the corresponding heat transmission path in the preceeding soldering operation. The temperature generated by the hot bar, such as the 350 degrees C., is high enough so that at the pre-tinned metal signal lines the temperature exceeds the eutectic temperature of the solder coating, and, at the solder pads on the circuit board in physical contact with respective ones of those signal lines, the temperature also exceeds the eutectic temperature of that solder coating as well. The solder then reflows. Upon reflowing, the heat is turned off, and the solder allowed to re-solidify, thereby additionally connecting the metal signal lines to their respective solder pads on the circuit board.

With both the bottom metal layer and the signal lines now attached, the cable and circuit board are again repositioned on the bed of the hot bar station so that the hot bar overlies the exposed end of the top metal layer 5 and the underlying solderpad 8. The hot bar is again heated and lowered into contact with the backside of cable 1. As before heat from the longitudinal edge of hot bar 22 passes through the insulating wrap layer or the top metal layer 5, and thence through the associated solder pad 8 on the circuit board substrate, to the support base of the hot bar station.

The latter formed serial heat transmission path is very short in comparison and is essentially almost a direct soldering. The temperature generated by the hot bar is high enough so that at the metal layer the temperature exceeds the eutectic temperature of the solder coating, and, at the solder pad on the circuit board in physical contact therewith, the temperature also exceeds the eutectic temperature of that solder coating as well. The solder then reflows. Upon reflowing, the heat is turned off, and the solder allowed to re-solidify, thereby additionally connecting the metal signal lines to their respective solder pads on the circuit board.

In essence, in the first two soldering operations above described the heating is indirectly applied to the surfaces being soldered, and encompasses one or more insulating layers. The last heating operation is akin to the prior art operation in which the heat bar is applied to the back side of the conductors that are to be soldered. However, each of the preceding soldering operations used to solder the cable in place applies heat through a heat transmissive path containing at least one insulator in series therewith, and thereby incorporates the novel soldering technique earlier described. It is appreciated, that a conventional clamp, not illustrated, may be used in the foregoing operations to assist in holding the cable 1 to the circuit board 2.

Figure 5:
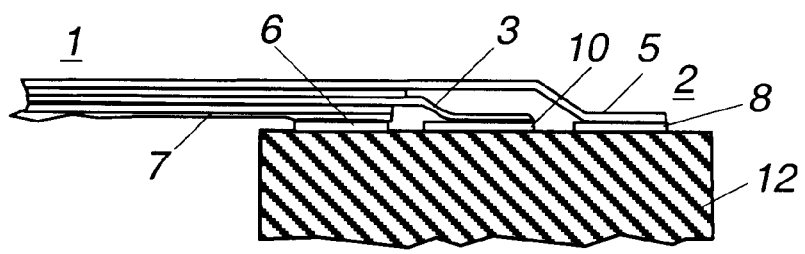
FIG. 5 illustrates in section the completed attachment.

The completed attachment is illustrated in a not-to-scale section view in FIG. 5, in which the numbers previously used to identify elements are used to identify the same elements. As attached, the outer shielding ground plane 5 covers or forms a tent over the signal lines 3. The other shielding ground plane 7 is joined to a grounded solder pad 6 located right next to solder pads 10. Thus the signal lines are shielded from interfering signals coming from the upper direction. And the ground current paths are very short, minimizing introduction of significant amounts of unwanted inductance. The new attachment structure thus provides the best overall protection for preventing interference signals from coupling to flex cable signal lines 3.

Reference is again made to the operation depicted in FIG. 4B, in which the hot bar 22 is used to reflow the solder on signal lines 3 and the corresponding solder pads 10 on circuit board 2. Those skilled in the art recognize the possibility that the heat from the hot bar could also migrate to the previously soldered connection of the bottom metal layer 7 and solder pad 6 and reflow solder there as well, possibly resulting in detachment. As an improvement aspect to the invention, the hot bar 22 is modified to support a clamping fixture to hold the other attachments in place, those not being worked upon with the hot bar, notwithstanding solder reflow at those attachments.

Figure 6:
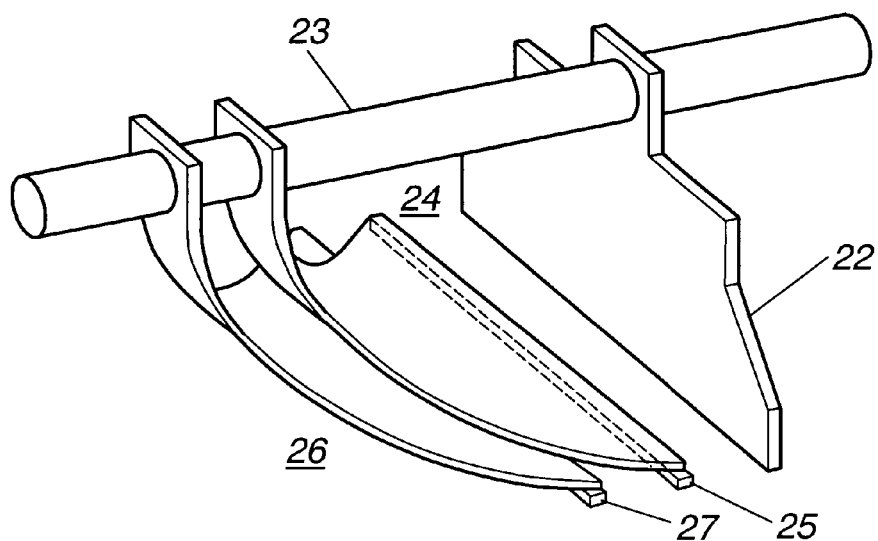
FIG. 6 illustrates a new fixture useful in practicing the described shielded stripline flex cable soldering process.

Reference is made to FIG. 6 which illustrates this modification of the hot bar structure that enhances the process for soldering the shielded cable described in FIGS. 4A through 4C. A passage is drilled through hot bar 22 to mount and support a cylindrical bar or tube 23. A pair of leaf spring assemblies 24 and 26 are in turn rigidly supported on the bar, at longitudinally spaced positions along the axis of the bar. The leaf springs hang down from the rigid connection at bar 23 and are convexly curved so as to resist a force pushing upward and contain a straight end edge. Rectangular shaped elongated bars 25 and 27 extend along that end edge of springs 24 and 26, respectively. The springs are biased to press downward and serve to hold the cable in place while soldering occurs. The bars at the end springs 24 and 26 are laterally spaced by the same distance by which the cable's bottom metal layer 7 is laterally spaced from the center of the exposed portion of its signal lines 3 and the end of the first spring 24 is spaced from the edge of hot bar 22 by the same distance by which the center of the exposed portion of its signal lines 3 is spaced from the center of the uncovered portion of the upper metal layer 7.

Figure 7:
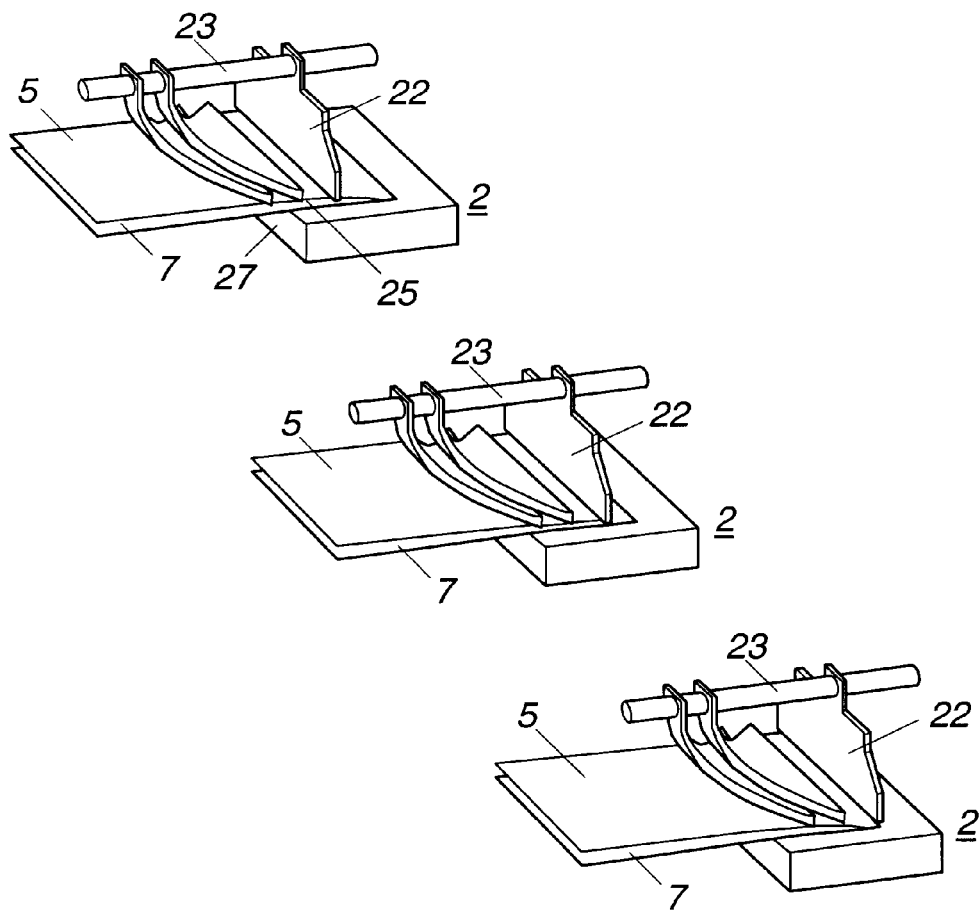
FIGS. 7A, 7B and 7C illustrate the procedures for attaching the flex cable to the cable termination using the fixture of FIG. 6.

The operation of that improvement apparatus is illustrated in FIGS. 7A through 7C, and is almost self-evident. FIG. 7A illustrates the attachment of the bottom ground plane layer 7 to its solder pad 6 on circuit board 2, which is accomplished as earlier described in connection with FIG. 4A.

FIG. 7B illustrates the connection of the cable's signal lines 3 to its associated solder pads in the next soldering operation. In this position leaf spring 24 applies a force to the backside of the cable at a position overlying the center of exposed metal layer 7. It holds down the previously soldered bottom ground plane connection of metal layer 7 to solder pad 6. Thus should the applied heating for soldering the signal lines 3 inadvertently extend to the ground plane layer, causing solder reflow at that location as well, spring 24 retains the ground plane layer in contact with its solder pad, when the heat is withdrawn upon completion of reflow at the signal lines, as earlier described in connection with FIG. 4B, and the solder resolidifies. In that way, the soldering of the signal lines does not result in undesired disconnection of the ground plane layer 5 from the circuit board.

FIG. 7C illustrates the attachment of the top ground plane 5 to circuit board 2, and the operation occurs substantially as described in connection with FIG. 4C. During that heating operation, the first and second leaf springs 24 and 26 respectively hold down the signal lines 3 and the bottom ground plane 7 attachments to their respective solder pads on the circuit board. In that way the soldering of the top ground plane layer 5 to its solder pad on the circuit board does not result in undesired disconnection of either the bottom ground plane layer 7 or the signal lines 3.

The leaf springs offer one way to hold the cable in place during soldering. As those skilled in the art appreciate, many alternative clamping structures may be substituted for the specific embodiment illustrated, including other spring biased clamping structures. Likewise, supporting the clamping arrangement on the hot bar is convenient, but alternative supporting arrangements may be substituted. As example, the leaf springs could be attached to the body of the hot bar station's piston instead of to the hot bar. Thus many alternative clamps and supports come to mind upon reading the foregoing description, all of which perform the same function in essentially the same or equivalent manner, and all of which are equivalents to the described leaf spring and its mounting.

Figure 8:
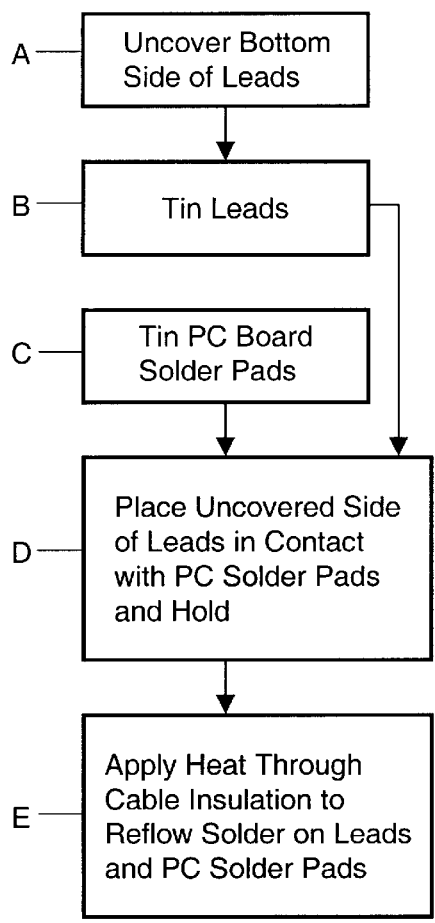
FIG. 8 illustrates the novel cable soldering process.

With an understanding of the foregoing embodiment, in retrospect, one easily recognizes that the soldering principles incorporated in the foregoing method and apparatus could have wider application than the solution to the particular problem described. Thus as illustrated in FIG. 8, the process is illustrated and described more generally as applied to any electrical cable, irrespective of the number of insulated electrical leads contained in that cable.

In each instance, and taking a cable containing a single electrical lead as an example, the electrical insulation is removed from at least the underside of the electrical conductor, as indicated at block A and the exposed portion of the conductor is tinned, as represented in block B to prepare the lead for soldering.

Figure 9:
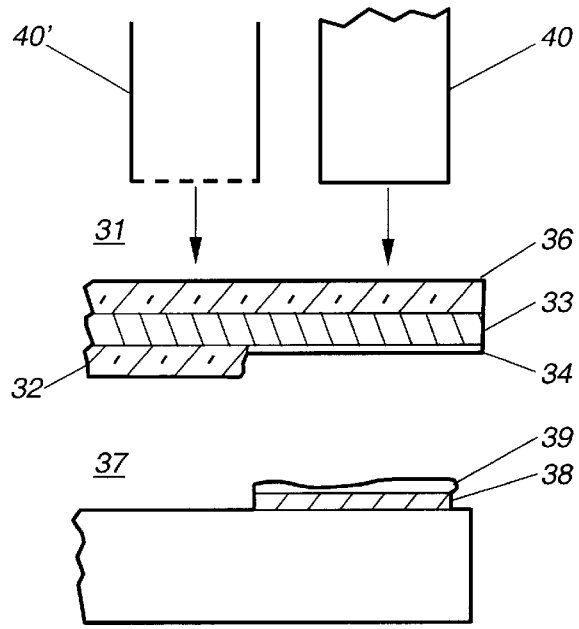
FIG. 9 illustrates another cable end configuration and cable end termination described in the process of FIG. 8.

The resulting cable end configuration at that stage is represented in FIG. 9, which shows the end of the cable 31 in a section view, electrical conductor 33, the coating of solder 34, front side electrical insulation 32 and backside electrical insulation 36.

Returning to FIG. 8, independently, the circuit board solder pad for the foregoing electrical lead is tinned with solder as represented at block B. The portion of the circuit board 37 and its solder pad 38 tinned with solder 39 is partially illustrated in FIG. 9.

Continuing with FIG. 8, the uncovered portion of the electrical conductor 34 is then held in physical contact with the tinned solder pad 38 as represented at block D. Then a source of heat 40, such as the hot bar earlier described, is applied to the backside of the cable at a location therealong at which the backside is covered with electrical insulation, represented at block E. The heat passes through the insulation, to the exposed portion of the electrical conductor, causing the solder on that conductor to reflow, and to the solder pad on the circuit board, causing its solder to reflow as well.

The source of heat is represented in FIG. 9, to which reference is again made. As shown the heating source 40 is applied directly to the insulation 36 on the backside of electrical conductor 33. Where the alternative arrangement in which electrical insulation is removed entirely from the end portion of the electrical conductor 33, that is, from both front and back sides, then the heat source 40' would be positioned adjacent to that exposed conductor portion and applied to the insulation 36. Once the solder has reflowed, the heat is withdrawn, such as by breaking contact with the electrical cable or shutting down the heating sources electrical power supply. As those skilled in the soldering art appreciate, the foregoing is procedure goes contrary to the accepted technique of applying the soldering heat source directly to the metal to be soldered.

As earlier noted in this specification one composition of electrical insulation acceptable for this procedure is the Kapton polyimide and a suitable solder is an Indium-Tin alloy. While the foregoing process might not offer the best manufacturing solution in any particular instance, its availability gives the electronics manufacturer an effective alternative choice to an existing soldering procedure, such as the fundamental soldering procedure of applying heat directly to the electrical conductor or to both that conductor and the solder pad with an electric soldering iron.

Stripline flexible cables offer the benefit of high density, multi-GHz operation and low cost. The foregoing method for attaching the cable to a PC board or equivalent successfully maintains those advantages. Even with the high density of leads in the cable, "fan-out" or staggering of the leads is not required. The cable attachment has low insertion loss and introduces minimal reflections. The attachment method is ideally suited for high speed assembly line production, since all solder connections can be made simultaneously. In tests, a practical embodiment containing 126 signals lines was attached in less than thirty seconds. In an automated system, the attachment time would be reduced to as little as two seconds.

It is believed that the foregoing description of the preferred embodiments of the invention is sufficient in detail to enable one skilled in the art to make and use the invention. However, it is expressly understood that the detail of the elements presented for the foregoing purpose is not intended to limit the scope of the invention, in as much as equivalents to those elements and other modifications thereof, all of which come within the scope of the invention, will become apparent to those skilled in the art upon reading this specification. Thus the invention is to be broadly construed within the full scope of the appended claims.

What is claimed is:

1. A method of attaching a shielded multi-lead flexible stripline cable to a circuit board;

providing said stripline cable containing an end configuration comprising:
   a substrate layer including a plurality of metal lines extending in parallel and in spaced relationship to one another metal lines to define multiple electrical leads;
   said plurality of metal lines having ends located at a first predetermined distance of the distal end of said cable;
   a first metal layer overlying said substrate layer to cover said metal lines, said first metal layer including an end portion extending from said first predetermined distance to said distal end of said cable, said end portion of said first metal layer having an uncovered underside surface;
   a first insulating layer separating said first metal layer from said substrate layer to prevent electrical contact between said metal lines and said first metal layer, said first insulating layer extending no farther than said end portion of said first metal layer;
   a second metal layer underlying said substrate layer to cover an underside of said metal lines, said second metal layer extending to a second predetermined distance of said distal end of said cable, said second predetermined distance being greater than said first predetermined distance;
   a second insulating layer separating said second metal layer from said substrate layer to prevent electrical contact between said metal lines and said second metal layer, said second insulating layer extending to within said second predetermined distance of said distal end of said cable, wherein at least a portion of each of said plurality of said metal lines are uncovered; and
said second metal layer having an end portion, said end portion of said second metal layer including an uncovered underside surface; wherein said first metal layer, said metal lines and said second metal layer define an inverted stepped configuration;
and providing said circuit board comprising:
   a dielectric substrate;
   first and second elongate strips of metal supported in spaced relation on said dielectric substrate and defining an intermediate region therebetween;
   a plurality of solder pads located in said intermediate region and in spaced relation to said first and second elongate strips, each of said plurality of solder pads being positioned in spaced relationship with one another to form at least one row of solder pads in said intermediate region;

said first and second elongate strips being aligned in parallel to define a rectangular shaped intermediate region and are each of a length approximately equal to a width of said stripline cable; and wherein said plurality of solder pads at least equals said multiple electrical leads in said multi-lead stripline cable;

comprising the steps of:

tinning with solder all uncovered metal layers and metal lines on said cable and all metal strips and solder pads on said circuit board;

placing said distal end of said cable over said circuit board to abut each of said metal layers of said cable and said plurality of metal lines to respective elongate metal strips and solder pads on said circuit board;

applying a hot bar to each of three spaced locations on said stripline cable to reflow solder at each of said metal layers and metal lines on said cable and said elongate strips and solder pads on said circuit board.

2. The method as defined in claim 1, wherein said step of applying a hot bar to each of three spaced locations on said stripline cable further comprises the steps of:

applying said hot bar to a first location on said first stripline cable overlying said uncovered end portion of said second metal layer on said cable and one of said metal strips on said circuit board to reflow solder on said second metal layer and said metal strip;

applying said hot bar to a second location on said stripline cable overlying said uncovered portion of said metal lines of said cable and said solder pads on said circuit board to reflow solder on said metal lines and said solder pads; and applying said hot bar to a third location on said stripline cable overlying said end portion of said first metal layer of said cable and the other one of said metal strips on said circuit board to reflow solder on said first metal layer and said other one of said metal strips.

3. The method as defined in claim 1, wherein said cable includes a layer of insulating material overlaying said first metal layer.

4. The method as defined in claim 1, wherein said plurality of metal lines extending in parallel and in spaced relationship to one another to define multiple electrical leads, comprises no less than one hundred and twenty five.

5. The method as defined in claim 4, wherein said solder comprises an Indium Tin alloy and wherein said insulating layers comprise a KAPTON polyimide material.

6. The method as defined in claim 4, wherein each of said metal lines comprises a width dimension no greater than four microns.

7. The method as defined in claim 5, wherein each of said metal lines comprises a width dimension no greater than four microns.

* * * * *